(12) United States Patent
Namekawa (10) Patent No.: US 7,590,018 B2
(45) Date of Patent: Sep. 15, 2009

(54) SENSE AMP CIRCUIT, AND SEMICONDUCTOR MEMORY DEVICE USING THE SAME

(75) Inventor: Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 12/040,297

(22) Filed: Feb. 29, 2008

(65) Prior Publication Data

US 2008/0212384 A1 Sep. 4, 2008

(30) Foreign Application Priority Data

Mar. 1, 2007 (JP) .............................. 2007-051203

(51) Int. Cl.
*G11C 7/00* (2006.01)
(52) U.S. Cl. ...................................... 365/205; 365/207
(58) Field of Classification Search ................. 365/205, 365/207, 156, 230.05
See application file for complete search history.

(56) References Cited

U.S. PATENT DOCUMENTS 6,016,065 A * 1/2000 Kong .......................... 326/121
6,147,514 A * 11/2000 Shiratake ..................... 327/55
6,239,624 B1 5/2001 Yang et al.
6,255,862 B1 * 7/2001 Kumagai et al. .............. 327/51
7,227,798 B2 * 6/2007 Gupta et al. ................ 365/205
2005/0007842 A1 1/2005 Nakashima

OTHER PUBLICATIONS

U.S. Appl. No. 11/968,893, filed Jan. 3, 2008, Toshimasa Namekawa.
U.S. Appl. No. 11/833,054, filed Aug. 2, 2007, Toshimasa Namekawa, et al.
Hiroshi Ito, et al., "Pure CMOS One-time Programmable Memory using Gate-Ox Anti-fuse", IEEE 2004 Custom Integrated Circuits Conference, 2004, pp. 469-472.

* cited by examiner

*Primary Examiner*—Anh Phung
(74) *Attorney, Agent, or Firm*—Oblon, Spivak, McClelland, Maier & Neustadt, P.C.

(57) ABSTRACT

A differential input circuit receives differential input signals at a pair of differential input terminals and produces a pair of first differential output signals. A sensing circuit senses at least one of the pair of first differential output signals reaching a certain voltage and provides an activation signal. A latch-type amplifier provides a pair of second differential output signals when activated in accordance with the activation signal. A cutoff circuit establishes connection between the differential input circuit and the latch-type amplifier and breaks connection between the differential input circuit and the latch-type amplifier in accordance with the activation signal.

13 Claims, 6 Drawing Sheets

SENSE AMP CIRCUIT, AND SEMICONDUCTOR MEMORY DEVICE USING THE SAME

CROSS-REFERENCE TO RELATED APPLICATION

This application is based upon and claims the benefit of priority from prior Japanese Patent Application No. 2007-51203, filed on Mar. 1, 2007, the entire contents of which are incorporated herein by reference.

BACKGROUND OF THE INVENTION

1. Field of the Invention

The present invention relates to a sense amp circuit and a semiconductor memory device using the same. In more detail, it relates to a sense amp circuit suitably applicable in a semiconductor memory device that uses an antifuse element of the gate insulator destruction type in a memory cell, and to a semiconductor memory device.

2. Description of the Related Art

In a recent large capacity semiconductor memory device, a relatively small capacity, nonvolatile memory device is mounted in combination on the same chip to store an address of a failed memory element contained. Similarly, also in a high-function, high-speed semiconductor logic circuit device, a relatively small capacity, nonvolatile memory element is mounted in combination for the purpose of holding production information and of storing an individual chip intrinsic number. Similarly, also in a high-precision analog circuit device, a relatively small capacity, semiconductor memory device is mounted in combination as well to store adjustment information for keeping the characteristic uniform.

As the semiconductor memory device employed in the above use, a semiconductor memory element called antifuse element operative to store 1-bit data by destroying a gate insulator of a MOS transistor is used, as found in examples. (See, for example, H. Ito et al., "Pure CMOS One-time Programmable Memory using Gate-OX Antifuse", Proceedings of the IEEE 2004 Custom Integrated Circuits Conference, PP. 469-472.) The antifuse element of the gate insulator destruction type is characterized in that it can be produced inexpensive without the need for any additional production step to the production thereof. Furthermore, since it is characterized in that it does not need any additional production step, it does not suffer from any deterioration of properties of major semiconductor elements mounted in combination on the same chip, such as fine-patterned memory elements for large capacity storage, high-speed transistors contained in high-speed logic circuits, and transistors for analog circuits exhibiting a high-precision electrical property. With these excellent characteristics, the antifuse element may be referred to as an optimal nonvolatile memory element for the above use.

A nonreversible memory element, such as the antifuse element, capable of holding data by destroying the internal structure or the composition of the constitutional substances may often be not excellent in reading electrical property. For example, the change in the amount of read current in accordance with the change in state is small, or the associated variation is large, or application of an appropriate voltage is required to obtain as large read current as some extent. Configuring a semiconductor memory device with such the memory element not excellent in reading electrical property can not lack the use of a high-precision sense amp that applies an appropriate bias voltage, accurately amplifies a very small read-out potential difference, and decides "0"/"1" of output data at appropriate timing.

Conventionally used high-precision sense amps operative to amplify a very small differential potential difference include a differential amplifier of the analog operation type. In general, an analog differential amplifier has advantages because a higher amplification rate can be set and a high-precision sense amp can be designed easily. To the contrary, the differential amplifier of the analog operation type has disadvantages because it consumes larger power and has a larger layout area.

On the other hand, the sense amp including the latch circuit has advantages because it has a simpler configuration and a smaller layout area, operates under a lower voltage, and consumes smaller power since current flows only at the instant of sensing. To the contrary, it has disadvantages because it has a lower amplification rate and a lower precision in comparison with the sense amp including the analog differential amplifier.

SUMMARY OF THE INVENTION

In one aspect the present invention provides a sense amp circuit, comprising: a differential input circuit operative to receive differential input signals at a pair of differential input terminals and produce a pair of first differential output signals; a sensing circuit operative to sense at least one of the pair of first differential output signals reaching a certain voltage and provide an activation signal; a latch-type amplifier operative to provide a pair of second differential output signals when activated in accordance with the activation signal; and a cutoff circuit operative to establish connection between the differential input circuit and the latch-type amplifier and break connection between the differential input circuit and the latch-type amplifier in accordance with the activation signal.

DETAILED DESCRIPTION OF THE EMBODIMENTS

The embodiments of the present invention will now be described in detail with reference to the drawings.

Figure 1:
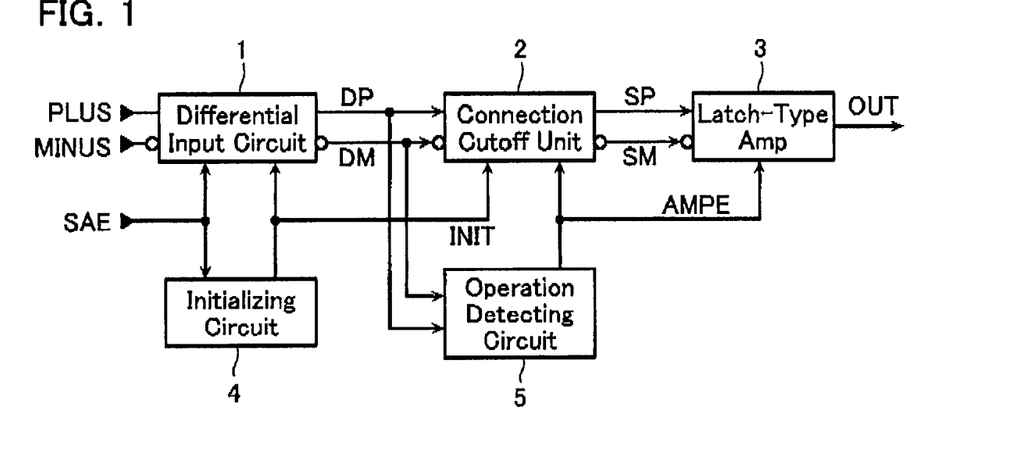
FIG. 1 is a block diagram showing a brief configuration of a sense amp circuit according to a first embodiment of the present invention.

FIG. 1 is a block diagram showing a brief configuration of a sense amp circuit according to a first embodiment of the present invention. The sense amp circuit of the first embodiment contains an automatic latch function, as obvious from the following description.

The sense amp circuit comprises a differential input circuit 1, a connection cutoff unit 2, a latch-type amplifier 3, an initializing circuit 4, and an operation detecting circuit 5.

The differential input circuit 1 is an analog differential amplifier operative to receive differential input signals PLUS and MINUS at a pair of differential input terminals. It differentially amplifies the differential input signals PLUS and MINUS to provide differential output signals DP and DM. One of the differential input signals PLUS and MINUS is a signal based on cell current read from a selected memory cell and the other is a signal based on a reference potential given from a reference potential generator circuit.

The differential input circuit 1 is activated on receipt of an activation signal SAE and enabled to operate in accordance with an initializing signal INIT.

When the activation signal SAE is in a certain state, the differential input circuit 1 operates such that the output signal DP is turned to a higher potential than DM if the input signal PLUS is higher in potential than the input signal MINUS. In other cases, the output signal DM is turned to a higher potential than DP to the contrary.

The connection cutoff unit 2 is arranged in signal lines that connect the differential input circuit 1 with the latch-type amplifier 3 to establish connection between both. The connection cutoff unit 2 has a function of breaking the signal lines on receipt of a later-described activation signal AMPE at certain timing. The connection cutoff unit 2 has an amplifying function and can be configured such that it amplifies the output signals DP and DM from the differential input circuit 1 to provide amplified differential output signals SP and SM.

The latch-type amplifier 3 is a differential amplifier of the latch type, which receives the output signals SP and SM from the connection cutoff unit 2 and differentially amplifies them to provide a differential output signal OUT as a result of the differential amplification. The latch-type amplifier 3 starts the above-described differential amplification when it is activated by the output of the later-described activation signal AMPE at certain timing.

The initializing circuit 4 receives the activation signal SAE and sets output terminals of the differential input circuit 1 at an initial potential (the ground potential Vss) when the activation signal SAE is in a first state. Thereafter, when the activation signal SAE turns to a second state, the initializing circuit 4 provides the initializing signal INIT that enables the differential input circuit 1 to start operation. The initializing signal INIT is fed to the differential input circuit 1 and the connection cutoff unit 2.

The operation detecting circuit 5 receives the output signals DP and DM from the differential input circuit 1 and, on detection of either one of the signals exceeding a certain voltage, provides the activation signal AMPE that causes the connection cutoff unit 2 to break connection and activates the latch-type amplifier 3.

Figure 2:
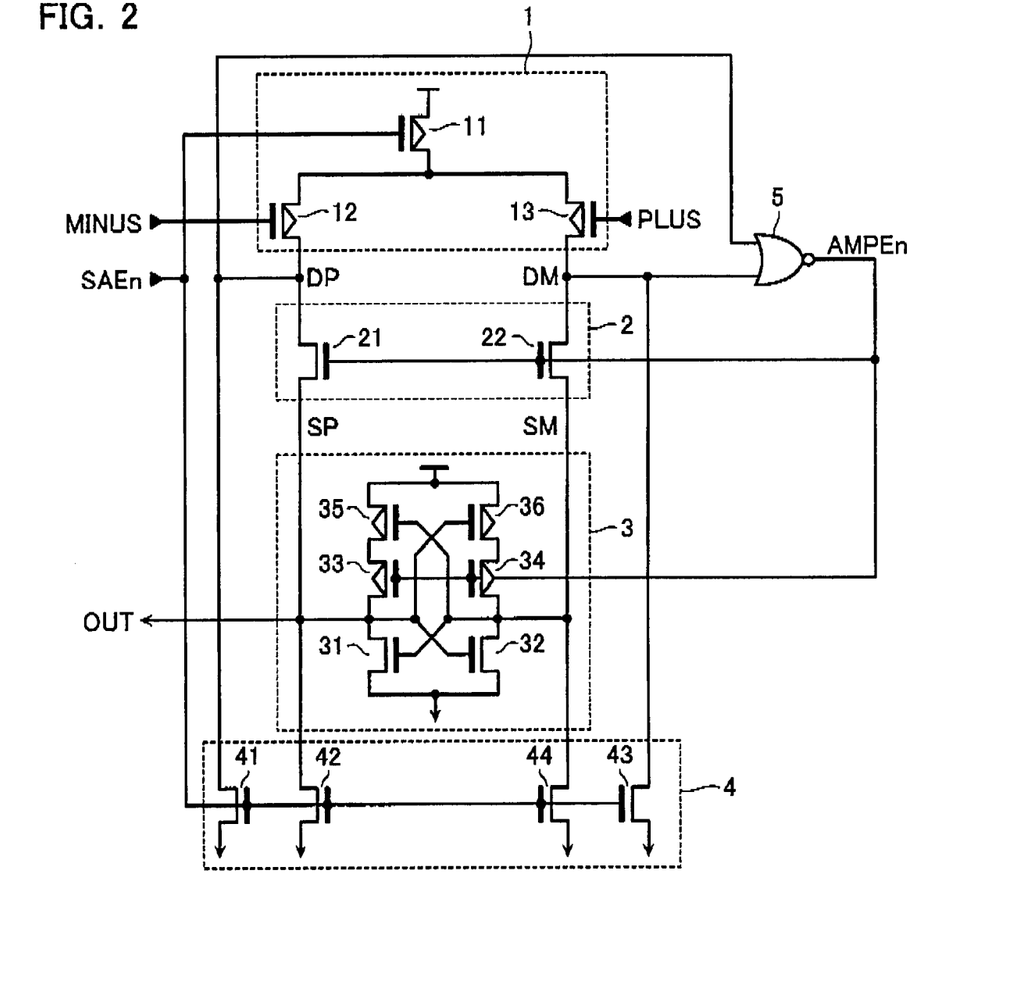
FIG. 2 is a circuit diagram showing a specific configuration example of the circuit in FIG. 1.

FIG. 2 shows a specific configuration example of the circuit in FIG. 1.

In this example, the differential input circuit 1 includes p-type MOS transistors 11-13. The p-type MOS transistor 11 has a source connected to a supply voltage, and a drain connected to sources of the p-type MOS transistors 12, 13. With this configuration, the p-type MOS transistor 11 serves as a constant current source transistor, which is turned on to supply drive current to the transistors 12, 13 while a negative logic activation signal SAEn is at "L". The p-type MOS transistors 12, 13 configure a pair of differential input gate transistors, which receive the differential input signals PLUS, MINUS at respective gates and provide the differential output signals DP, DM from respective drains.

The connection cutoff unit 2 includes a pair of n-type MOS transistors 21, 22. The n-type MOS transistors 21, 22 are turned off when a negative logic activation signal AMPEn is made "L" to isolate the differential input circuit 1 from the latch-type amplifier 3. While the activation signal AMPEn is at "H", it serves as a source follower circuit, which receives the differential output signals DP, DM at drains and provides the slightly amplified differential output signals SP, SM.

The latch-type amplifier 3 includes n-type MOS transistors 31, 32 and p-type MOS transistors 33-36.

The n-type MOS transistors 31, 32 have gates connected cross to respective drains, and sources commonly connected to the ground potential to form an n-type latch circuit. The p-type MOS transistors 33,34 are connected between the transistors 35 and 31 and between the transistors 36 and 32, respectively. When the activation signal AMPEn given to the gates is made "L", the p-type MOS transistors 33,34 are turned on to activate the latch-type amplifier 3.

The p-type MOS transistors 35,36 have sources commonly connected to the supply voltage, drains connected to the p-type MOS transistors 33,34, and gates connected cross to the drains of the n-type MOS transistors 32, 31. Thus, the p-type MOS transistors 35,36 configure a p-type latch circuit. In this example, the drain of the n-type MOS transistor 31 is used as an output node for the output signal OUT. The n-type MOS transistors 31, 32 receive at the drains the output signals SP and SM from the connection cutoff unit 2. This circuit is configured to receive the input signal SP from the latch-type amplifier 3 and provide the associated output signal OUT to external at an identical node.

The initializing circuit 4 includes four n-type MOS transistors 41, 42, 43, 44. The four n-type MOS transistors 41, 42, 43, 44 have sources commonly connected to the ground potential, and drains respectively connected to the output terminals of the differential output signals DP, SP, SM, DM.

The four MOS transistors 41, 42, 43, 44 have gates connected to the activation signal SAEn. Namely, while the activation signal SAEn is kept at "H", the four MOS transistors 41, 42, 43, 44 are turned on to execute initializing operation to give the ground potential on the sources to the output terminals of the differential output signals DP, SP, SM, DM. (This operation to give the ground potential corresponds to the output of the above initializing signal INIT.) When the activation signal SAEn is turned to "L", it terminates the initializing operation.

The operation detecting circuit 5 includes a NOR logic circuit having two input terminals. The paired input terminals are connected to the paired output signals DP and DM from the differential input circuit 1, respectively. The NOR logic circuit has an output terminal, from which the negative logic activation signal AMPEn is provided to external. The NOR logic circuit operates under the supply voltage also supplied to the differential input circuit 1 and so forth to switch the activation signal AMPEn to "L" when the output signal DP or DM reaches around one-half of the supply voltage.

Operation of the sense amp circuit shown in FIG. 2 is described next using the timing charts of FIGS. 3, 4 and 5.

First, while the sense amp circuit is in a pre-operation state (on standby: before time T2), the activation signal SAEn at "H" keeps the differential input circuit 1 inactive. Thereafter, when the activation signal SAEn turns to "L" at time T2, it activates the differential input circuit 1.

At previous time T0, the input signals PLUS and MINUS are initialized to a potential of 0 V by an equalizing circuit, not shown. At this time, the negative logic activation signal SAEn is kept at "H" and, under the control thereof, the initializing circuit 4 operates to initialize all the internal signals DP, DM, SP (OUT), SM in the sense amp to 0 V.

Next, the equalizing circuit (not shown) terminates equalizing at time T1, and memory cells, not shown, are connected to the terminal of the signal PLUS on the differential input circuit 1. Then, a very small read current flowing in a "1" holding data memory cell starts charging a parasitic capacitor associated with the terminal of the signal PLUS. In addition, the terminal of the signal MINUS on the differential input circuit 1 is similarly connected to a reference voltage generator circuit, not shown. While this condition is retained, the potential of one input signal PLUS from the differential input circuit 1 becomes around 100 mV and the potential of the other input signal MINUS around 50 mV at time T2. In a word, the very small read current flowing in the memory cell holding "1" data causes a very small potential difference of, for example, about 50 mV between the PLUS signal and the MINUS signal.

When the activation signal SAEn is kept at "H", the initializing circuit 4 receives it and initializes the output terminals of the output signals DP, DM, SP, SM (to 0 V). At this time, on receipt of the differential output signals DP and DM kept at the initial potential, the operation detecting circuit 5 senses the differential input circuit 1 being inactive and turns the activation signal AMPEn to "H". The connection cutoff unit 2 receives the activation signal AMPEn="H" and retains connection between the differential input circuit 1 and the latch-type amplifier 3.

On receipt of the activation signal AMPEn="H" at the gates of the p-type MOS transistors 33, 34, the latch-type amplifier 3 becomes inactive and leaves the output signal OUT at "L". This standby state is also a preparation stage for sensing as described subsequently and a low-power consumption state at the same time because the differential input circuit 1 and the latch-type amplifier 3 are suppressed to operate.

Next, prior to the activation of the differential input circuit 1 (time T2), a standby time is provided until the states of the differential input signals PLUS and MINUS are fixed. In the case shown in FIG. 1, the former is higher than the latter (in reading "1" data). If the differential input circuit 1 is activated in an initial state with no potential difference between the differential input signals PLUS and MINUS or in an incorrect state with an inverse potential relation, the differential input circuit 1 may amplify the abnormal state and provide an abnormal result possibly (An output signal OUT different from the data to be read out is obtained). If the abnormal result is output, and then the latch-type amplifier 3 once latches the abnormal state, the output signal OUT cannot make a transition to a correct result again. This situation is not improved if the differential input signals PLUS and MINUS might make a transition to a correct state after the output of the abnormal result. Therefore, prior to the activation of the differential input circuit 1 (time T2), the states of the differential input signals PLUS and MINUS should be fixed.

Next, when the activation signal SAEn falls down to "L", it activates the differential input circuit 1 and turns off the n-type MOS transistors 41-44 in the initializing circuit 4. (Namely, the initializing circuit 4 terminates initializing the output signals DP, DM, SP, SM.) Namely, the p-type MOS transistor 11 serving as the constant current source in the differential input circuit 1 turns on and starts supplying current to the p-type MOS transistors 12 and 13.

At this time, if the input signal PLUS is slightly higher than MINUS, the current flowing in the transistor 12 becomes larger than the current flowing in the transistor 13. As a result, the potential of the signal DP rises faster than the potential of the signal DM. Thus, a potential difference starts growing between the output signals DM, DP in response to the potential difference between the differential input signals PLUS, MINUS. At this time, as the connection cutoff unit 2 has been turned off yet, the potentials of the output signals SP and SM also rise accordingly. As the output signal SP is also the output signal OUT, the output signal OUT also rises accordingly.

The potential difference between the differential output signals DP and DM becomes larger than the potential difference between the differential input signals PLUS and MINUS through the action of amplifying by the differential input circuit 1. The connection cutoff unit 2 also has a function of amplifying such that the potential difference caused between the differential output signals SP and SM becomes slightly larger than the potential difference between the differential output signals DP and DM.

Namely, the n-type MOS transistors 21, 22 contained in the connection cutoff unit 2 are used as source followers. Accordingly, the output signals SP and SM respectively follow the input signals DP and DM while the input signals DP and DM are still at lower potentials. As the input signals DP and DM make transitions to higher potentials, however, the connection has a higher resistance, which starts dissociation between the output signal SP and the input signal DP and between the output signal SM and the input signal DM. The output signals SP and SM from the connection cutoff unit 2 are connected to the paired n-type MOS transistors 31 and 32 contained in the latch-type amplifier 3. The transistors 31, 32 serving as loads yield the action of amplifying in the connection cutoff unit 2 such that the potential difference between the output signals SP and SM becomes larger than that the potential difference between the input signals DP and DM.

The operation detecting circuit 5 senses whether or not the potential of at least one of the output signals DP and DM is higher than, for example, one-half of the supply voltage, In the sense amp circuit of this embodiment, the potential measurement accuracy of the operation detecting circuit 5 itself is not important. Rather, the operational characteristic of the differential input circuit 1 as the analog differential amplifier circuit is important. If the differential input circuit 1 is optimized, it can be regarded that, by sensing the potential of either one of the output signals DP and DM reaching around one-half of the supply voltage, a sufficiently large potential difference is caused between the output signals DP and DM. Therefore, a NOR logic circuit comprising a CMOS circuit may be available as the operation detecting circuit 5. This NOR logic circuit provides the activation signal AMPEn="L" when it senses at least one of the output signals DP, DM reaching around one-half of the supply voltage (time T3).

On receipt of the activation signal AMPEn "L" output from the operation detecting circuit 5 at time T3, the connection cutoff unit 2 breaks connection between the differential input circuit 1 and the latch-type amplifier 3. Thus, the output terminals of the differential output signals DP and DM and the differential output signals SP and SM are brought into high-impedance states.

At the same time, on receipt of the activation signal AMPEn ="L", the latch-type amplifier 3 is activated. At this time, at least one of the output signals SP and SM is amplified up to around one-half of the supply voltage or higher. Accordingly, even a low-amplification ability latch-type amplifier can amplify the potential difference caused between the output signals SP and SM up to the supply voltage to provide the output signal OUT. At this time, the connection cutoff unit 2 isolates the differential input circuit 1 or analog amplifier from the latch-type amplifier 3 to suppress power consumption.

Finally, when the activation signal SAEn is returned again to "H" at time T4, the differential input circuit 1 terminates sensing and becomes standby and the initializing circuit 4 initializes the signals DP, DM, SP, SM. The output signal OUT is also turned again to "L" though the output signal OUT can be retained in a latch circuit (not shown) operative to latch the output signal OUT using the activation signal SAEn as a trigger signal.

As described above, in this embodiment, the differential input circuit 1 or analog amplifier and the connection cutoff unit 2 amplify the differential input signals PLUS and MINUS to obtain the amplified differential output signals DP, DM, SP, SM. When the operation detecting circuit 5 senses that the differential output signals DP, DM are amplified to some extent, the latch-type amplifier 3 is activated and the differential input circuit 1 is isolated therefrom by the connection cutoff unit 2. Optimization of device constants of the differential input circuit 1 and the connection cutoff unit 2 enables an improvement in sensing accuracy and an improvement in sensing speed to be satisfied at the same time. In addition, even if the current flowing in the differential input circuit 1 is enhanced, the connection cutoff unit 2 can suppress the period of time of operation of the differential input circuit 1 as short as possible. Accordingly, power consumption in the entire sense amp can be rather reduced.

Also in this embodiment, operation of the latch-type amplifier 3 is started when the output signals DP, DM from the differential input circuit 1 are amplified up to around one-half of the supply voltage. This is effective to prevent the latch-type amplifier 3 from erroneously sensing. This point is described with reference to FIG. 4. FIG. 4 shows operation when the differential output signals PLUS, MINUS are smaller than those in FIG. 3.

If the differential input signals PLUS, MINUS are very small at time T2, the potential difference caused between the output signals DP and DM from the differential input circuit 1 also becomes small (the voltage rises slowly). Similarly, the potential difference caused between the output signals SP and SM from the connection cutoff unit 2 also becomes small (the voltage rises slowly).

If the latch-type amplifier 3 starts operation at the same timing as in FIG. 2 or time T3', the potential difference between the input signals SP and SM is too small. Accordingly, an influence of the offset in the latch-type amplifier 3 may cause erroneous sensing of data at a high risk.

In the present embodiment, however, the operation detecting circuit 5 works such that the time T3 of activation of the latch-type amplifier 3 is delayed until the output signal DP or DM from the differential input circuit 1 reaches around one-half of the supply voltage. If the latch-type amplifier 3 is activated at this timing, a sufficient potential difference is caused between the input signals SP and SM to the latch-type amplifier 3. Accordingly, the risk of erroneous sensing of data can be reduced even if the latch-type amplifier 3 contains more or less offset.

Further, in accordance with the present embodiment, a high-precision sense amp circuit can be configured easily. Realization of a high-precision sense amp requires effective measures including: setting a smaller amount of current flowing through the p-type MOS transistor 11 or the constant current source in the differential input circuit 1 than the current drive ability of the p-type MOS transistors 12, 13; setting a longer channel length L such that the p-type MOS transistors 12, 13 operate in the pentode region; and setting a larger gate area to achieve matched device properties of the p-type MOS transistors 12, 13.

Similarly, it is effective to set a larger gate area to achieve matched device properties of the n-type MOS transistors 21 and 22 contained in the connection cutoff unit 2 and the n-type MOS transistors 31 and 32 contained in the latch-type amplifier 3. It is also effective to set a larger channel width W of these transistors to enhance the current drive ability of the device.

Also in accordance with the present embodiment, the sensing speed can be easily set higher. For that purpose, it is effective to set a larger channel width W of the p-type MOS transistor 11 or the constant current source to increase the value of current flowing in the differential input circuit 1. It is also effective to set a larger channel width W of the p-type MOS transistors 12, 13 to increase the current drive ability of the device and a smaller channel length L to reduce the parasitic capacity.

Similarly, as for the n-type MOS transistors 21 and 22 contained in the connection cutoff unit 2 and the n-type MOS transistors 31 and 32 contained in the latch-type amplifier 3, it is effective to set a smaller channel length L and a smaller channel width W to reduce the parasitic capacity so long as the balance can be kept between the current drive ability of the transistors and the value of current flowing through the constant current source 11.

Thus, through adjustment of the device constants of the transistors contained in the differential input circuit 1, the connection cutoff unit 2 and the latch-type amplifier 3, the required sensing accuracy and sensing speed can be realized. Tradeoffs may arise among some items though the required sensing accuracy and sensing speed can be satisfied at the same time in many cases if an increase in current consumption and an increase in layout area are allowed. Even if the current flowing in the differential input circuit 1 is enhanced, the power consumed in the entire sense amp can be rather reduced because the differential input circuit 1 is allowed to operate within a minimum period of time.

Figure 3:
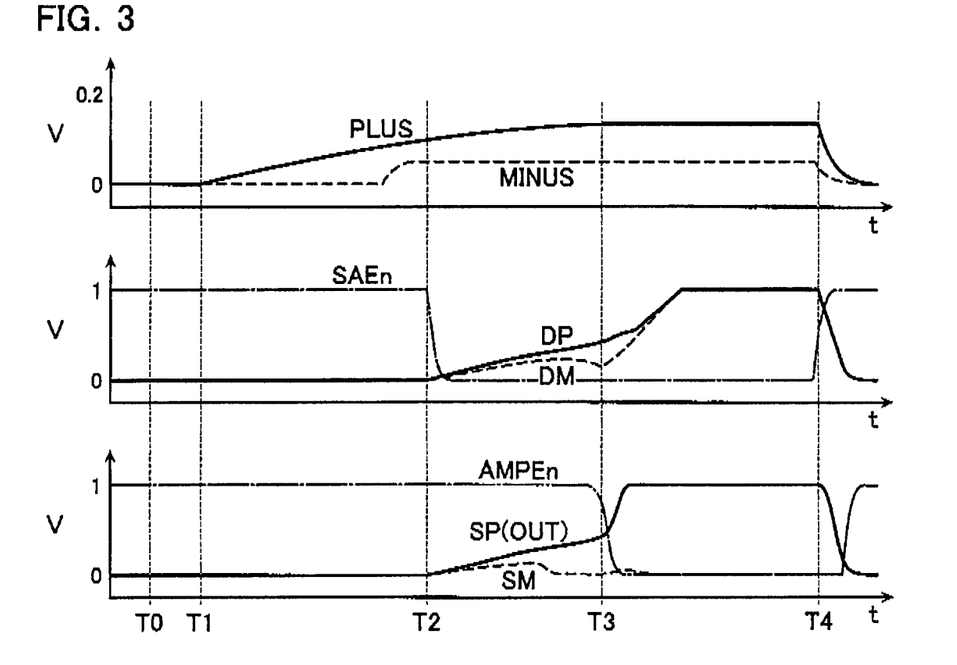
FIG. 3 is a timing chart illustrative of operation of the sense amp circuit in the first embodiment.
Figure 4:
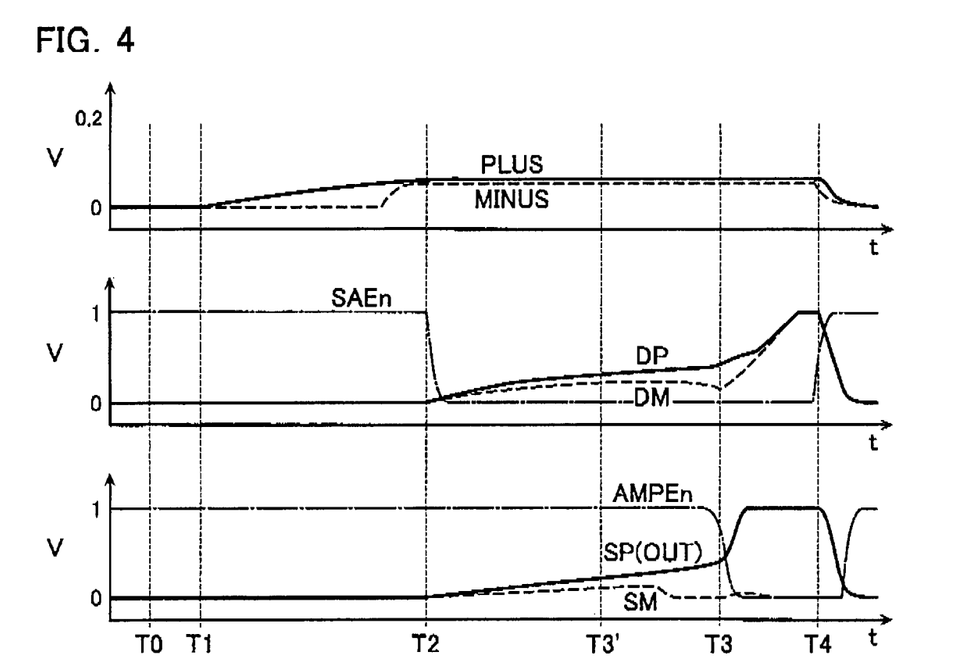
FIG. 4 is a timing chart illustrative of operation of the sense amp circuit in the first embodiment.

FIGS. 3 and 4 show operational waveforms on reading the memory cell holding "1" data. Referring next to FIG. 5 showing operational waveforms on reading a memory cell holding "0" data, the effect of the present embodiment is described.

Figure 5:
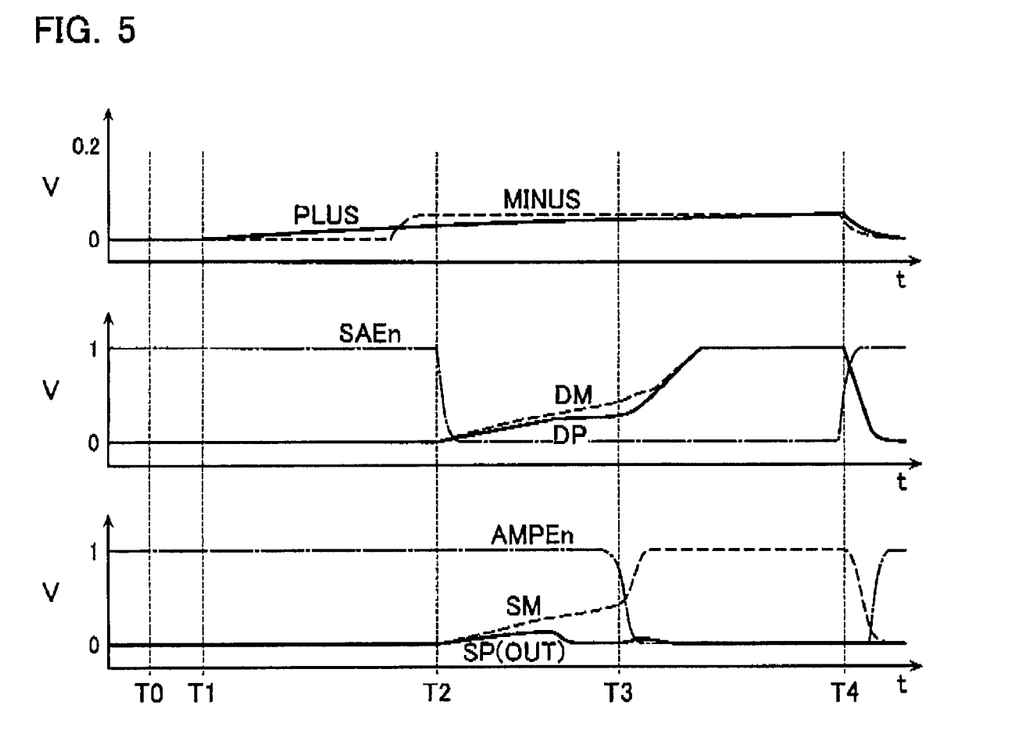
FIG. 5 is a timing chart illustrative of operation of the sense amp circuit in the first embodiment.

In FIG. 5, the memory cell holding "0" data is selected. Therefore, the read current is extremely small, and the potential of the differential input signal PLUS at time T2 becomes a lower potential than the differential input signal MINUS used as the reference potential. If the differential input circuit 1 starts operation in this condition, as for the differential output signals DP and DM, the latter has a higher potential, and as for the differential output signals SP and SM, the latter has a higher potential similarly.

A problem arises herein on the following phenomenon if the memory cell holding "0" data is selected and the selected condition is kept unchanged for a longer period of time. Namely, in this case, the potential of the input signal PLUS connected to that memory cell becomes floated and loses the potential difference from the input signal MINUS based on the reference power source, and finally results in an inverted potential relation (around time T4 in FIG. 5). Ideally, if the memory cell holding "0" data is selected, the read current is very small. Therefore, the potential of the input PLUS signal based thereon is expected to continuously stay at the initial state of 0 V. In practice, however, very small leakage current and noises from other circuits influence, and the potential of the input signal PLUS becomes floated after left for a longer period of time. Prevention of erroneous sensing of "0" data due to the influence of this phenomenon requires termination of sensing as soon as possible after the beginning of sensing to fix the output signal OUT. In a word, it is required to advance the time T3 of beginning operation of the latch-type amplifier 3.

As described in FIG. 4, however, on reading from the memory cell holding "1" data, only a very small potential difference may be caused between the differential input signals PLUS and MINUS if the concerned memory cell has no excellent electrical property. In this case, advancing the time T3 of beginning operation of the latch-type amplifier 3 leads to erroneous sensing of data.

In the sense amp circuit of the present embodiment, however, the operation detecting circuit 5 starts operation of the latch-type amplifier 3 at an appropriate time in accordance with each operational condition. With this configuration, depending on the read data being "0" data or "1" data, and in accordance with the read current being large or small, it is possible to start operation of the latch-type amplifier 3 at an appropriate time, and isolate the differential input circuit 1 by the connection cutoff unit 2. Therefore, the present embodiment can provide a high-speed, high-precision and low-power consumption sense amp circuit.

Second Embodiment

Figure 6:
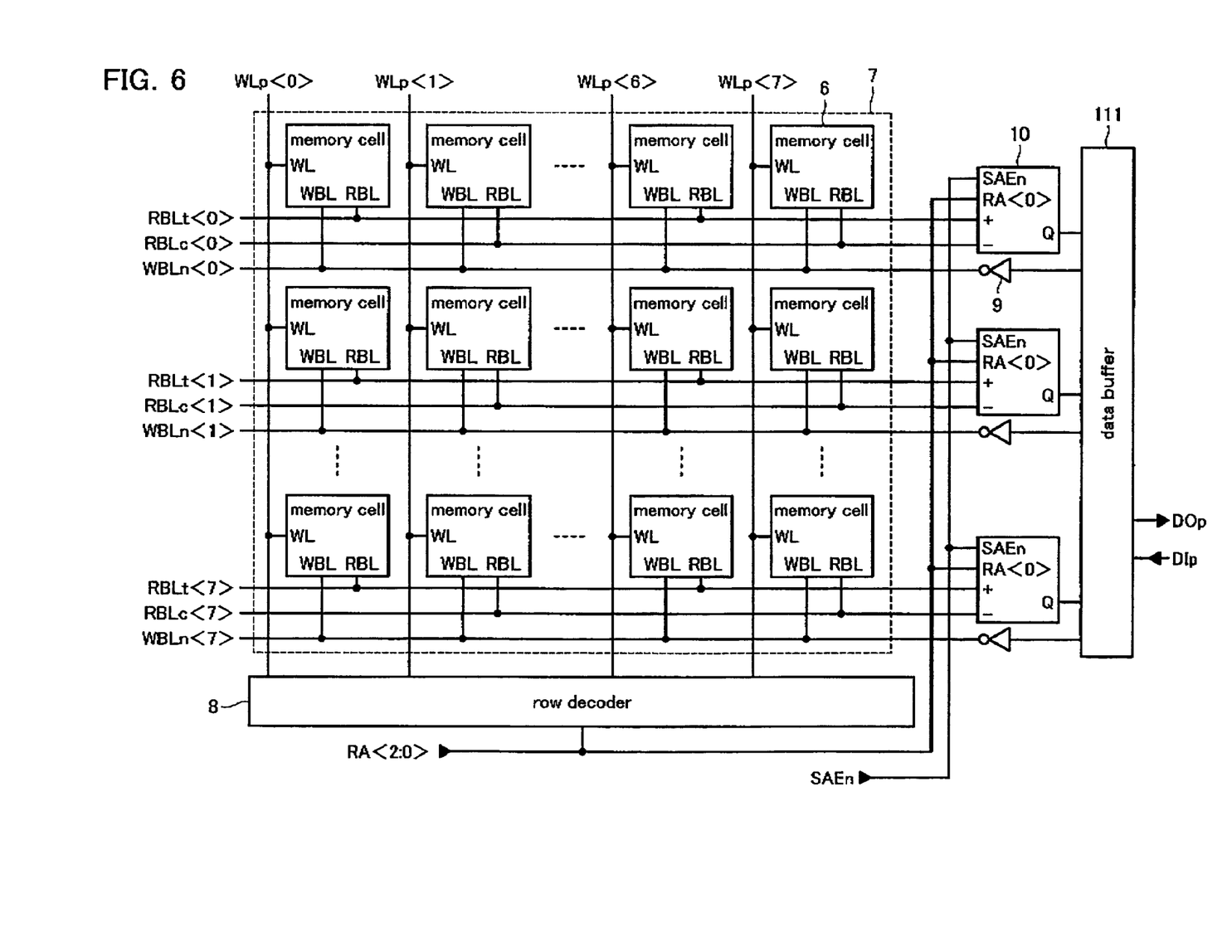
FIG. 6 is a block diagram showing a brief configuration of a sense amp circuit according to a second embodiment of the present invention.

FIG. 6 shows a configuration of the major part of a nonvolatile semiconductor device according to a second embodiment of the present invention. The present embodiment relates to a nonvolatile semiconductor memory device using a sense amp circuit 10 with an automatic latching function.

In the present embodiment, a memory cell array 7 comprises memory cells 6 arranged in grid.

A memory cell 6 is connected to a word line WL, a write signal line WBL, and a read signal line RBL. The memory cell 6 is provided with a plate electrode for applying a high voltage of around 6 V on writing and a low voltage of around 1 V on reading, which is though not a major constituent and accordingly not shown in the figure.

In the memory cell array 7, the memory cells 6 arranged in row are each commonly connected to row selection lines WLp<0-7>. The row selection lines WLp<0-7> are driven by a row decoder 8 and selectively activated by a row address RA<2:0> given to the row decoder B.

On the other hand, the memory cells 6 arranged in column are each commonly connected to write bit lines WBLn<0-7>. The write bit lines WBLn<0-7> are driven with respective write buffers 9.

In parallel with the write bit lines WBLn<0-7>, paired read bit lines RBLt<0-7> and RBLc<0-7> are provided. One-half of the memory cells 6 arranged in column are commonly connected to true read bit lines RBLt<0-7> and the remaining half of the memory cells 6 similarly arranged in column are commonly connected to complement read bit lines RBLc<0-7>.

The paired read bit lines RBLt<0-7> and RBLc<0-7> are connected to true input terminals (+) and complementary input terminals (−) on respective read sense amps 10. The outputs of the read sense amps 10 and the inputs of the above write buffers 9 are connected to a data buffer 11. The data buffer 11 is provided with a data output DOp and a data input DIp on the other side. The data buffer 11 is used to control exchanges of data between the semiconductor memory device and the outside thereof.

Figure 7:
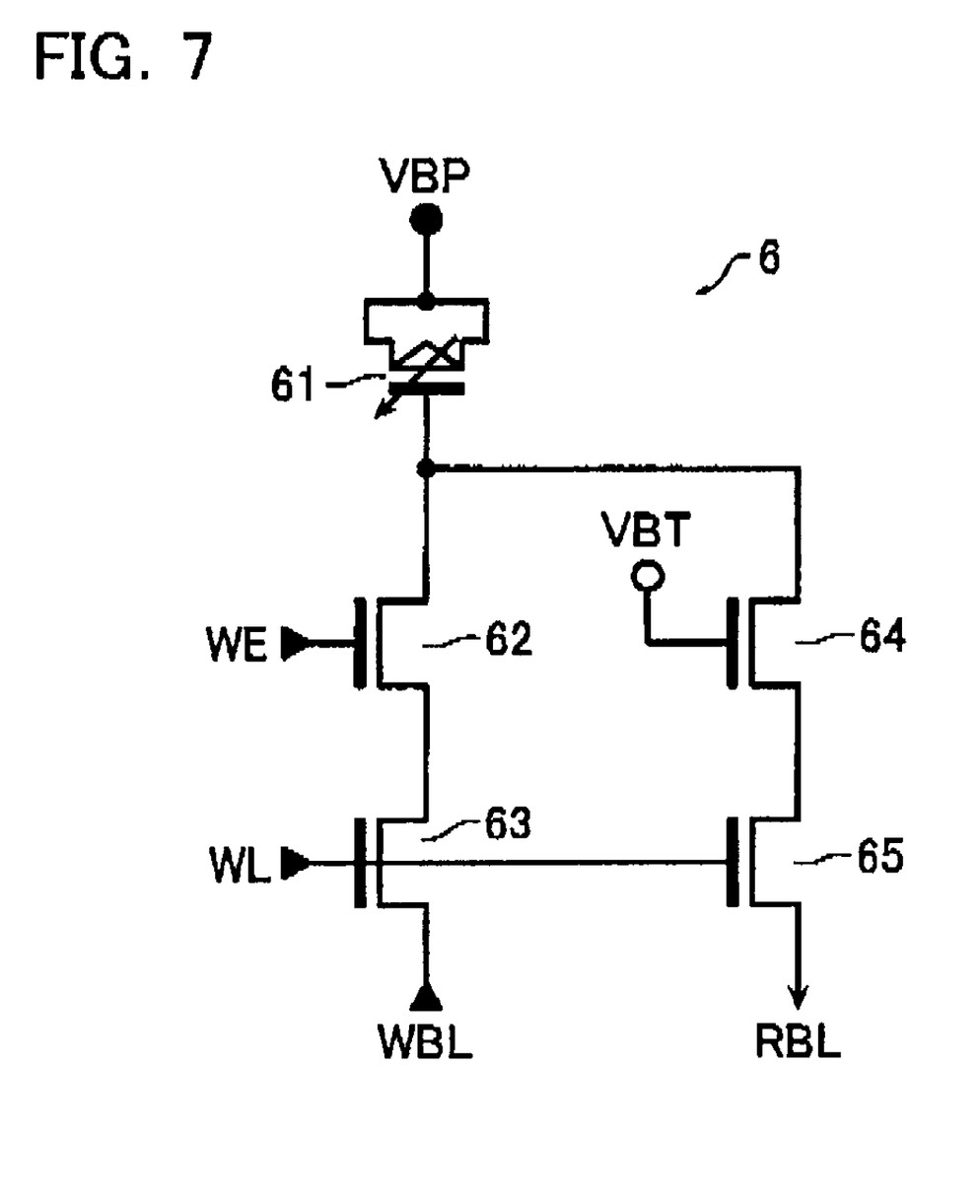
FIG. 7 shows a specific configuration example of a memory cell 1 in FIG. 6.

FIG. 7 shows a configuration example of the memory cell 6. The memory cell 6 includes an antifuse element 61; a write control element 62 to be turned on at the time of writing; a barrier element 64 operative to prevent application of a high-voltage stress to a read selection element 65 on writing; a write selection element 63 to be selectively turned on; and a read selection element 65 to be selectively turned on similarly.

There are various semiconductor elements available as the elements 61-65 though a p-type MOS transistor is used as the antifuse element 61 and n-type MOS transistors as the other elements in the example of FIG. 7.

The antifuse element 61 has a source, a drain and a bulk electrode all short-circuited and connected to a write power source VBP. The antifuse element 61 has a gate insulator, which has a higher resistance under the normal condition and a lower resistance after the gate insulator is broken down with application of the high-voltage stress. With the utilization of this variation in electrical property, it is used as a nonvolatile memory cell operative to hold "0" data under the higher resistance condition and "1" data under the lower resistance condition.

The gate electrode is connected to the write control element 62 and the barrier element 64.

The write control element 62 has a gate connected to the write control signal WE, and the barrier element 64 has a gate connected to a barrier power source VBT, The write power source VBP, the barrier power source VBT and the write control signal WE are commonly connected to all the memory cells 6.

The write control element 62 has a source connected to a write bit line WBL via the write selection element 63. Similarly, the barrier element 64 has a source connected to a read bit line RBL via the read selection element 65. The write selection element 63 and the read selection element 65 have respective gates both connected to a row selection line WL.

Writing of information in the antifuse element 61 can be executed through the following procedural steps. First, the write power source VBP is brought into a high potential sufficient to breakdown the gate insulator. At this time, the antifuse element 61 and additionally the write control element 62, the write selection element 63, the barrier element 64 and the read selection element 65 are preferably protected from undesired high voltage stresses applied thereto. For that purpose, the barrier power source VBT, the write control signal WE, the row selection line WL, the write bit line WBL and the read bit line RBL are simultaneously brought into somewhat high potentials. For example, a p-type MOS transistor usually used with a power source of 1 V is used as the antifuse element 61, and n-type MOS transistors usually used with a power source of 3 V are used as the other control elements. In such the case, it is appropriate to set the potential of the write power source VBP at 6 V and the potentials on the other terminals at 3 V.

Next, the row selection line WL connected to the write-targeted memory cell 61 is held selected at a high potential of 3 V while the other row selection lines WL are held non-selected at a low potential of 0 V. Further, the write bit line WBL connected to the write-targeted memory cell 6 is held at a low potential of 0 V while the other write bit lines WBL are held at a high potential of 3 V. At this time, the read bit lines RBL are similarly treated, and the read bit line RBL connected to the write-targeted memory cell 6 is held at a low potential of 0 V while the other read bit lines RBL are held at a high potential of 3 V. Alternatively, all the read bit lines RBL are brought into high-impedance states. Thus selected is the memory cell 6 connected to the row selection line WL at a high potential and to the write bit lines WBL at a low potential.

Applied across both terminals of the memory element 61 in the selected memory cell 6 is a voltage of 6 V given from the power source VBP. This state is continuously retained to breakdown the gate insulator of the memory element 61 in the selected memory cell 6 in the end. The breakdown occurs locally in the shape of a pin hole with a diameter of around 50 nm. Further, a high voltage is continuously applied to this very small breakdown spot to cause a relatively large current flow of 2 mA or more. This writing changes the composition of the breakdown spot and the peripheral thereof to form a conductive path with a relatively low resistance. Thereafter, the application of the voltage is intercepted to terminate the writing.

Reading of data from the antifuse element 61 is described next. First, all the row selection lines WL and the write control signals WE are held at 0 V and the write power source VBP at a potential of 1 V insufficient to breakdown the gate insulator. In this state, reading is started.

At the same time, the barrier power source VBT is set at a high potential, for example, 1.8 V to turn on the barrier element 64. While retaining this condition, the potential on the read bit line RBLt is initialized to 0 V. Through the initializing, a sufficient voltage to obtain read current is applied to the antifuse element 61.

Next, the read bit line is brought into a high-impedance state or a bias current of around 1 μA is passed, and the row selection line WL is selectively set at a high potential, for example, 1.8 V.

In reading, the write bit line WBL may be at a low potential or at a high potential, for example, 1.8 V so long as the device can not be broken down.

While this condition is retained, if the antifuse memory element 61 holds "1" data, the antifuse memory element 61 has a lower resistance. Therefore, current flows in the read bit line RBLt, and the read bit line RBLt makes a transition to a high potential.

In contrast, if the antifuse memory element 61 holds "0" data, the antifuse memory element 61 has a higher resistance. Therefore, current hardly flows in the read bit line RBLt, and the potential on the read bit line RBLt remains near the initial potential of 0 V. Thereafter, to the read bit line RBLc paired with the read bit line RBLt connected to the selected memory cell 6, a reference power source, not shown, is connected to apply an intermediate potential of, for example, 0.1 V thereto.

Thereafter, the potential difference caused between the selected read bit line RBLt and the reference read bit line is sensed at the read sense amp 10 to determine whether the data stored in the selected memory cell 6 is "0" or "1". The result is then provided to the output terminal Dop via the data buffer 11.

Figure 8:
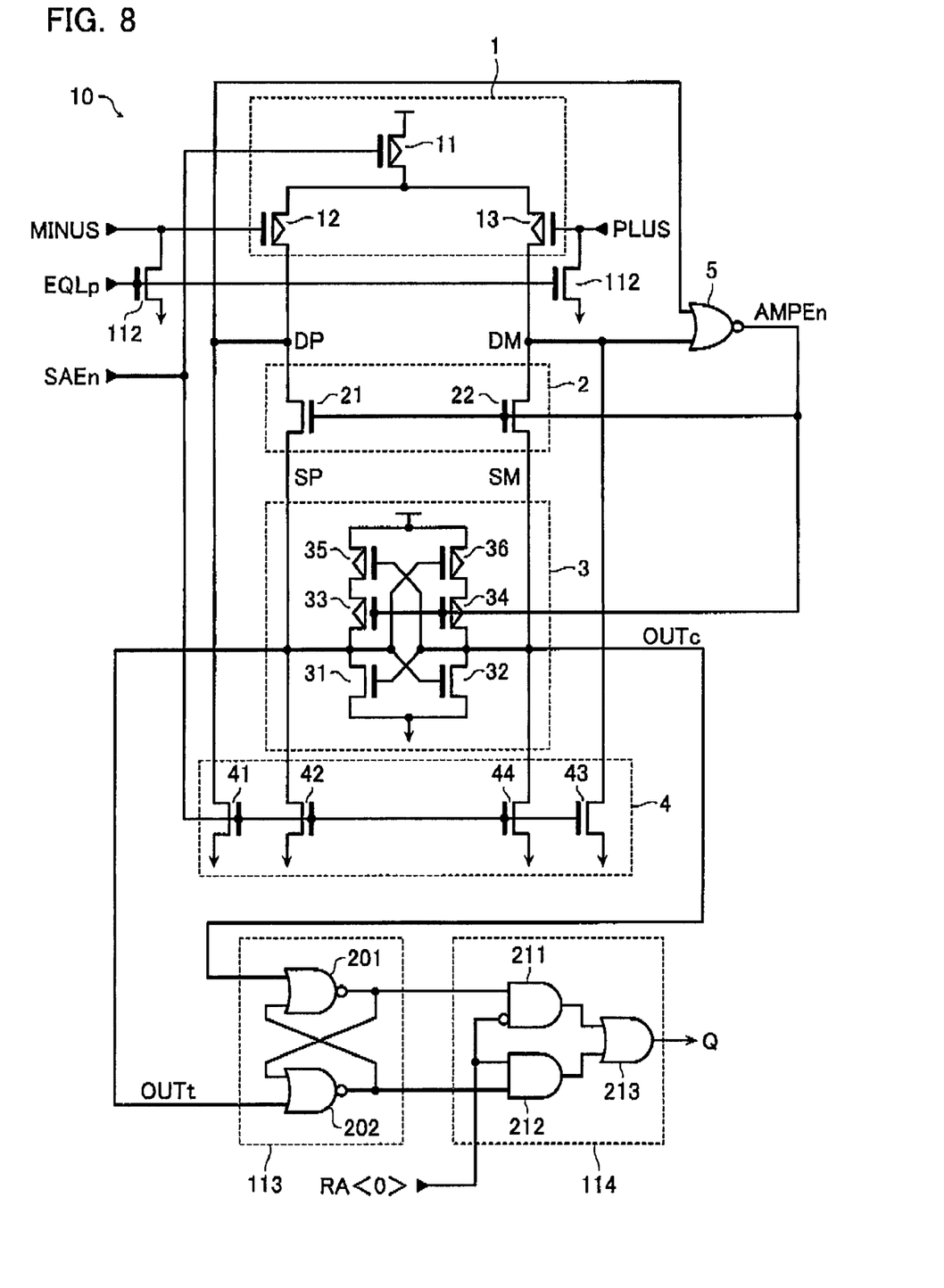
FIG. 8 shows a specific configuration example of a sense amp circuit 10 in FIG. 6.

FIG. 8 shows a configuration example of a sense amp circuit 10 available in the second embodiment. The sense amp circuit 10 is almost similar to the sense amp circuit 10 shown in FIG. 2 and the same constituents are denoted with the same reference numerals and omitted from the following detailed description. The paired read bit lines RBLt and RBLc are connected to the gates of the transistors 12 and 13, respectively.

The sense amp circuit 10 comprises an equalizing circuit 112 operative to short-circuit the paired read bit lines RBLt and RBLc to initialize them to an equalizing voltage VBLEQ. The equalizing circuit 112 includes two n-type MOS transistor shaving respective gates, which receive an equalizing signal EQLp thereon.

The sense amp circuit 10 is configured to provide complementary output signals OUTt, OUTc from the latch-type amplifier. The output signal OUTt is provided from a connection node between the transistors 33 and 31 and the output signal OUTc is provided from a connection node between the transistors 34 and 32.

The output signals OUTt, OUTc are latched in a latch circuit 113. The latch circuit 113 includes two NOR circuits 201, 202 and receives the output signal OUTt at one input terminal of the NOR circuits 201 and the output signal OUTc at one input terminal of the NOR circuits 202. The NOR circuits 201, 202 have respective output terminals each interconnected to the other input terminal. With this configuration, the signals OUTt, OUTc can be latched.

The complementary output signals from the latch circuit 113 are fed to a selection switch 114. The selection switch 114 includes logic gates 211-213. The logic gate 211 has one input terminal to receive the output signal (true or complementary) from the latch circuit 113 and the other input terminal to receive the least significant signal RA<0> in a row address. The logic gate 212 has one input terminal to receive the output signal (complementary or true) from the latch circuit 113 and the other input terminal to receive the least significant signal RA<0> in a row address. The logic gate 213 is operative to provide a logical sum of output signals from the logic gates 211, 212.

The selection switch 114 provides positive logic data (data corresponding to the latched data in the latch circuit 113) as the output signal Q when the least significant signal RA<0> in the row address is Low, that is, a memory cell at an even address is selected. On the other hand, the selection switch 114 provides negative logic data (inverted data of the latched data in the latch circuit 113) as the output signal Q when the least significant signal RA<0> in the row address is High, that is, a memory cell at an odd address is selected.

With this function of the selection switch 114, even if either a memory cell 1 at an even address or a memory cell 1 at an odd address is selected, and if the antifuse element 7 contained in the concerned memory cell 1 is not programmed, the output signal Q becomes Low or 0. On the other hand, if the antifuse element 7 is programmed, the output signal Q becomes High or 1. In other words, in the absence of the selection switch 114, the output signal Q (the output signal from the latch circuit 113) on reading a memory cell 1 that stores an even "1" differs from that on reading a memory cell 1 that stores an odd "1". In the presence of the selection switch 114, on the contrary, such the situation can be avoided.

The embodiments of the invention have been described above though the present invention is not limited to these embodiments but rather can be given various modifications, additions and so forth without departing from the scope and spirit of the invention.

What is claimed is:

1. A sense amp circuit, comprising:
   a differential input circuit operative to receive differential input signals at a pair of differential input terminals and produce a pair of first differential output signals;
   a sensing circuit operative to sense at least one of said pair of first differential output signals reaching a certain voltage and provide an activation signal;
   a latch-type amplifier operative to provide a pair of second differential output signals when activated in accordance with said activation signal; and
   a cutoff circuit operative to establish connection between said differential input circuit and said latch-type amplifier and break connection between said differential input circuit and said latch-type amplifier in accordance with said activation signal.

2. The sense amp circuit according to claim 1, wherein said cutoff circuit includes transistors connected between output terminals of said differential input circuit and input terminals of said latch-type amplifier and turned on/off in accordance with said activation signal.

3. The sense amp circuit according to claim 1, further comprising an initializing circuit operative to keep potentials on output terminals of said differential input circuit at initial potentials prior to activation of said differential input circuit.

4. The sense amp circuit according to claim 1, wherein said initializing circuit includes n-type MOS transistors connected between output terminals of said differential input circuit and the ground terminal.

5. The sense amp circuit according to claim 1, wherein said differential input circuit includes
   a first transistor having one end given a supply voltage and operative to turn on when a control terminal thereof is given said activation signal, and
   a second transistor and a third transistor each having one end connected to the other end of said first transistor, a control terminal given a respective one of said differential input signals, and the other end operative to provide a respective one of said first differential output signals to external.

6. The sense amp circuit according to claim 5, wherein said cutoff circuit includes transistors connected between output terminals of said differential input circuit and input terminals of said latch-type amplifier and turned on/off in accordance with said activation signal.

7. A semiconductor memory device, comprising:
   a memory cell array of memory cells arranged in matrix;
   a plurality of word lines arranged in said memory cell array to select said memory cells in a row direction;
   a pair of read bit lines arranged in a direction orthogonal to said word lines to read data from said memory cells;
   a write bit line arranged in a direction orthogonal to said word lines to write data in said memory cells; and
   a sense amp operative to amplify a potential difference caused between said pair of read bit lines,
   wherein said sense amp includes
      a differential input circuit having a pair of differential input terminals connected to said pair of read bit lines and operative to produce a pair of first differential output signals,
      a sensing circuit operative to sense at least one of said pair of first differential output signals reaching a certain voltage and provide an activation signal,
      a latch-type amplifier operative to provide a pair of second differential output signals when activated in accordance with said activation signal, and
      a cutoff circuit operative to establish connection between said differential input circuit and said latch-type amplifier and break connection between said differential input circuit and said latch-type amplifier in accordance with said activation signal.

8. The semiconductor memory device according to claim 7, wherein said cutoff circuit includes transistors connected between output terminals of said differential input circuit and input terminals of said latch-type amplifier and turned on/off in accordance with said activation signal.

9. The semiconductor memory device according to claim 7, further comprising an initializing circuit operative to keep potentials on output terminals of said differential input circuit at initial potentials prior to activation of said differential input circuit.

10. The semiconductor memory device according to claim 7, wherein said initializing circuit includes n-type MOS transistors connected between output terminals of said differential input circuit and the ground terminal.

11. The semiconductor memory device according to claim 7, wherein said differential input circuit includes
    a first transistor having one end given a supply voltage and operative to turn on when a control terminal thereof is given said activation signal, and
    a second and a third transistor having one end connected to the other end of said current source transistor, a control terminal given a respective one of said differential input signals, and the other end from which a respective one of said first differential output signals is provided to external.

12. The semiconductor memory device according to claim 11, wherein said cutoff circuit includes transistors connected between output terminals of said differential input circuit and input terminals of said latch-type amplifier and turned on/off in accordance with said activation signal.

13. The semiconductor memory device according to claim 7, further comprising:
    a latch circuit operative to latch said second differential output signals; and
    a selection switch operative to provide either data corresponding to data latched in said latch circuit or inverted data of said latched data, based on the least significant signal in a row address for use in selection of said memory cells.

* * * * *